United States Patent
Choi et al.

(10) Patent No.: US 12,270,122 B2
(45) Date of Patent: Apr. 8, 2025

(54) SILICON CARBIDE WAFER AND SEMICONDUCTOR DEVICE

(71) Applicant: SENIC Inc., Cheonan-si (KR)

(72) Inventors: Jung Woo Choi, Cheonan-si (KR);
Myung Ok Kyun, Cheonan-si (KR);
Jong Hwi Park, Cheonan-si (KR);
Jung Doo Seo, Cheonan-si (KR);
Jung-Gyu Kim, Cheonan-si (KR);
Kap-Ryeol Ku, Cheonan-si (KR)

(73) Assignee: SENIC Inc., Cheonan-si (KR)

( * ) Notice: Subject to any disclaimer, the term of this patent is extended or adjusted under 35 U.S.C. 154(b) by 479 days.

(21) Appl. No.: 17/836,470

(22) Filed: Jun. 9, 2022

(65) Prior Publication Data

US 2022/0403551 A1 Dec. 22, 2022

(30) Foreign Application Priority Data

Jun. 17, 2021 (KR) .................. 10-2021-0078554

(51) Int. Cl.
| | |
|---|---|
| *H01L 29/16* | (2006.01) |
| *C30B 25/20* | (2006.01) |
| *C30B 29/36* | (2006.01) |
| *H01L 29/34* | (2006.01) |
| *H01L 29/78* | (2006.01) |

(52) U.S. Cl.
CPC ............. *C30B 29/36* (2013.01); *C30B 25/20* (2013.01); *H01L 29/1608* (2013.01); *H01L 29/34* (2013.01); *H01L 29/7813* (2013.01)

(58) Field of Classification Search
CPC ... C30B 25/186; C30B 29/36; H01L 29/1608; H01L 29/34
See application file for complete search history.

(56) References Cited

U.S. PATENT DOCUMENTS

| | | | | |
|---|---|---|---|---|
| 11,034,058 B2* | 6/2021 | Matsumoto | ....... | H01L 21/02433 |
| 2007/0009812 A1* | 1/2007 | Ito | ....... | G03F 7/70958 |
| | | | | 430/5 |
| 2013/0020585 A1* | 1/2013 | Ishibashi | ....... | H01L 29/868 |
| | | | | 438/510 |
| 2013/0256700 A1* | 10/2013 | Ishibashi | ....... | H01L 29/045 |
| | | | | 257/77 |
| 2021/0060818 A1* | 3/2021 | Matsumoto | ....... | H01L 21/0262 |
| 2021/0272793 A1* | 9/2021 | Park | ....... | H01L 29/1608 |
| 2022/0364267 A1* | 11/2022 | Nagashima | ....... | H01L 21/0254 |

FOREIGN PATENT DOCUMENTS

| | | |
|---|---|---|
| KR | 10-0675216 B1 | 1/2007 |
| KR | 10-2018-0016585 A | 2/2018 |

* cited by examiner

*Primary Examiner* — Jaehwan Oh
(74) *Attorney, Agent, or Firm* — NSIP Law

(57) ABSTRACT

A silicon carbide wafer has one surface and the other surface opposite to the one surface. An average Rmax roughness of the one surface is 2.0 nm or less, and an average Ra roughness of the one surface is 0.1 nm or less. An edge region is a region in which a distance from an edge of the silicon carbide wafer toward a center is 5% to 75% of a radius of the silicon carbide wafer, and a central region is a region having a radius of 25% of the radius of the silicon carbide wafer at the center of the silicon carbide wafer. A difference between an average Rmax roughness of the edge region of the one surface and an average Rmax roughness of the central region of the one surface is 0.01 nm to 0.5 nm.

10 Claims, 7 Drawing Sheets

Example 1

Example 2

C. Example 1

C. Example 2

Example 1

Example 2

C. Example 1

C. Example 2

SILICON CARBIDE WAFER AND SEMICONDUCTOR DEVICE

CROSS-REFERENCE TO RELATED APPLICATIONS

This application claims the benefit under 35 USC 119(a) of Korean Patent Application No. 10-2021-0078554, filed on Jun. 17, 2021, in the Korean Intellectual Property Office, the entire disclosure of which is incorporated herein by reference for all purposes.

TECHNICAL FIELD

The present invention relates to a silicon carbide wafer and a semiconductor device fabricated therefrom.

BACKGROUND ART

Silicon carbide (SiC) has excellent heat resistance and mechanical strength, and is physically and chemically stable, so that it is attracting attention as a semiconductor material. Recently, as a substrate for high-power devices, the demand for silicon carbide single crystal substrates is increasing.

As a method for preparing a SiC single crystal, there are Liquid Phase Epitaxy (LPE), Chemical Vapor Deposition (CVD), Physical Vapor Transport (PVT), and the like. PVT is a method of growing a SiC single crystal by loading SiC raw materials into a crucible, disposing a seed crystal composed of a SiC single crystal on the top of the crucible, and then heating the crucible by an induction heating method to sublimate the raw materials to grow the SiC single crystal on the seed crystal.

PVT is the most widely used for the preparation of SiC in the form of an ingot because it has a high growth rate. However, a density of current flowing a crucible may change depending on characteristics of a crucible and a heat insulator and process conditions, etc., and the temperature distribution inside a crucible may also change, thereby causing bending and distortion of a SiC ingot to be prepared. When such bending and distortion occur, a difference in the processing degree between the center and the edge of a wafer appears during a subsequent fabrication process of a wafer, and accordingly roughness properties, optical properties, etc. may vary.

When an epitaxial layer is formed on a wafer cut from a silicon carbide ingot, manufacturing yield may be affected by optical properties as well as surface roughness properties of the silicon carbide wafer. If there is a difference in roughness on the surface of the silicon carbide wafer or if there is a problem in the optical properties, the quality of the epitaxial layer may be deteriorated, and there is a risk that the properties or the manufacturing yield of the device may be reduced when manufacturing a semiconductor device.

Therefore, in order to improve the performance and the manufacturing yield of a semiconductor device manufactured from a silicon carbide wafer, it is necessary to consider a method capable of satisfying various characteristics when manufacturing a silicon carbide ingot and manufacturing a silicon carbide wafer.

The above-described background technology is technical information acquired by the inventor for the derivation of an embodiment or acquired during the derivation process and is not necessarily a prior art disclosed to the general public before filing the present disclosure.

As related prior art, there are "Method for manufacturing epitaxial silicon carbide single crystal wafer" disclosed in Korean Patent Publication No. 10-2018-0016585, "Method for measuring haze and apparatus thereof" disclosed in Korean Patent Publication No. 10-0675216, etc.

SUMMARY

An object of an embodiment is to provide a silicon carbide wafer that satisfies good roughness characteristics and optical characteristics.

Another object of an embodiment is to provide a silicon carbide wafer providing an improved manufacturing yield in a device manufacturing.

According to an embodiment of the present invention, a silicon carbide wafer has one surface and the other surface opposite to the one surface. An average Rmax roughness of the one surface is 2.0 nm or less, and an average Ra roughness of the one surface is 0.1 nm or less. An edge region is a region in which a distance from an edge of the silicon carbide wafer toward a center is 5% to 75% of a radius of the silicon carbide wafer, and a central region is a region having a radius of 25% of the radius of the silicon carbide wafer at the center of the silicon carbide wafer. Here, a difference between an average Rmax roughness of the edge region of the one surface and an average Rmax roughness of the central region of the one surface is 0.01 nm to 0.5 nm.

A total light transmittance for a D65 standard light source may be 10% to 40%.

The average Rmax roughness of the one surface may be 1.5 nm or less.

The difference between the average Ra roughness of the edge region of the one surface and the average Ra roughness of the central region of the one surface is 0.08 nm or less.

A haze for a D65 standard light source may be 0.3% to 0.5%.

The average Ra roughness of the silicon carbide wafer may be 0.07 nm or less.

The one surface may be a Si surface where silicon atoms appear more mainly than carbon atoms.

A diameter of the silicon carbide wafer may be 4 inches or more and may include 4H-silicon carbide.

An epitaxial wafer according to an embodiment of the present invention includes an above-described silicon carbide wafer, and an epitaxial layer that is formed on the one surface of the silicon carbide wafer.

A semiconductor device according to an embodiment of the present invention includes: an above-described silicon carbide wafer; an epitaxial layer that is formed on the one surface of the silicon carbide wafer; a barrier region disposed opposite to the silicon carbide wafer with the epitaxial layer interposed therebetween; a source electrode in contact with the epitaxial layer; a gate electrode disposed on the barrier region; and a drain electrode disposed on the other surface of the silicon carbide wafer.

The silicon carbide wafer according to an embodiment has excellent roughness and optical properties in almost all areas of the surface and may exhibit uniform quality.

The silicon carbide wafer according to an embodiment may improve device characteristics and yield when manufacturing an epitaxial layer and a device.

DETAILED DESCRIPTION

Figure 1:
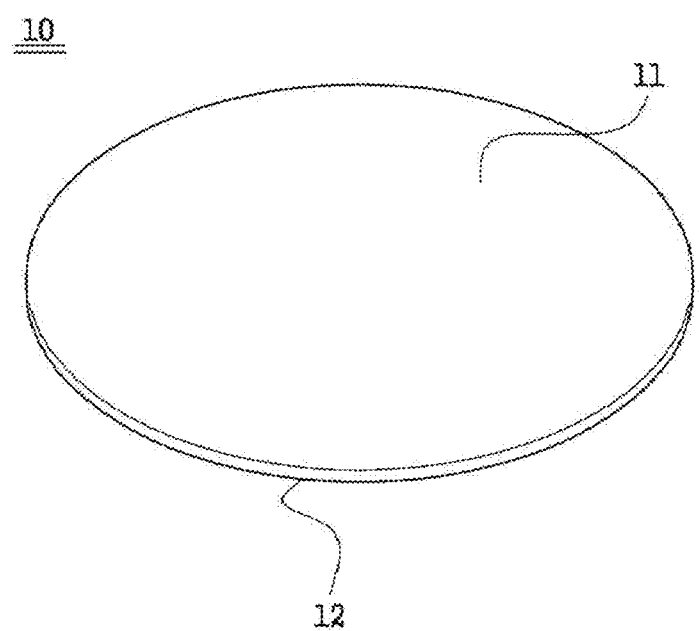
FIG. 1 is a conceptual view showing an example of a silicon carbide wafer according to an embodiment.

Hereinafter, one or more embodiments will be described in detail with reference to the accompanying drawings. However, the embodiments may be implemented in many different forms and are not limited to the embodiments described herein. Throughout the specification, the same reference numerals are assigned to similar parts.

Throughout the present disclosure, the phrase that a certain element "comprises" or "includes" another element means that the certain element may further include one or more other elements but does not preclude the presence or addition of one or more other elements, unless stated to the contrary.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween.

In this disclosure, the meaning that B is positioned on A means that B is positioned to be directly on A or B is positioned to be on A while another layer is positioned therebetween and is not construed as being limited to that B is positioned to abut on the surface of A.

In this disclosure, the term "combination of these" included in the expression of the Markush format means one or more mixtures or combinations selected from the group consisting of the components described in the expression of the Markush format, and it means to include one or more selected from the group consisting of the components.

In this disclosure, the description "A and/or B" means "A or B, or A and B."

In this disclosure, terms such as "first," "second," "A," or "B" are used to distinguish the same terms from each other.

In this disclosure, a singular form is contextually interpreted as including a plural form as well as a singular form unless specially stated otherwise.

Silicon Carbide Wafer 10

In order to achieve the above object, a silicon carbide wafer 10 according to an embodiment includes one surface 11 and the other surface that are opposite to each other, wherein an average Rmax roughness of the one surface is 2.0 nm or less, wherein an average Ra roughness of the one surface is 0.1 nm or less, wherein an edge region is a region in which the distance from the edge of the silicon carbide wafer toward the center is 5% to 75% of the radius of the silicon carbide wafer, wherein a central region is a region having a radius of 25% of the radius of the silicon carbide wafer from the center of the silicon carbide wafer, and wherein a difference between an average Rmax roughness of the edge region of the one surface and the average Rmax roughness of the central region of the one surface is 0.01 nm to 0.5 nm.

Rmax roughness (Maximum peak to valley height) is parallel to the center line (reference line) of the roughness curve within a certain length of the surface roughness curve of the workpiece and represents the vertical distance between two parallel lines respectively passing the lowest point (valley) and the highest peak (peak) of the roughness curve.

In an embodiment, when manufacturing an epitaxial wafer and a device based on a silicon carbide wafer, it is noted that the Rmax roughness and the Ra roughness are related to the device manufacturing yield, and it is intended to provide a silicon carbide wafer satisfying the predetermined Rmax roughness and the Ra roughness conditions.

Meanwhile, a total transmittance (Tt) represents the sum of the parallel transmittance (Tp) and the diffusion transmittance (Td) when light passes through the inside of a material. In addition, a haze refers to a phenomenon in which light is diffused rather than a reflection or an absorption depending on the type and the state of the material to show an opaque appearance when light passes through the inside of a material. The haze can be calculated by measuring the diffuse transmittance and the total light transmittance as in Equation 1.

$$H = Td/(Tt \times 100) \qquad \text{[Equation 1]}$$

where H is the haze, Td is the diffuse transmittance and Tt is the total light transmittance.

In an embodiment, when manufacturing an epitaxial wafer and a device based on a silicon carbide wafer, it is understood that the total light transmittance and the haze value, which are optical properties, are related to the device manufacturing yield, and the silicon carbide wafer that satisfies a predetermined total light transmittance and haze value is provided. Specific measurement procedures are described in the following experimental examples.

The silicon carbide wafer 10 may have a haze of 0.3% to 0.5%, 0.3% to 0.4%, or 0.34% to 0.37% for the D65 standard light source. When the upper limit of the haze range is exceeded, there is a risk that the defect rate increases when manufacturing an epitaxial wafer and a device. By satisfying the above haze range, pit-shaped defects can be prevented, and a manufacturing yield can be improved when manufacturing epitaxial wafers and devices.

The silicon carbide wafer 10 may have a total light transmittance of 10% to 40%, 15% to 35%, or 20% to 30% for the D65 standard light source. If it has such a total light transmittance range, a good silicon carbide wafer quality can be exhibited.

The D65 standard light source corresponds to a daylight having a color temperature close to 6504K.

Referring to FIG. 1, the one surface 11 is a so-called Si surface where silicon atoms appear more mainly thereon compared to other atoms, and the other surface 12, which is the opposite side of the one surface, is a so-called C surface where carbon atoms appear mainly thereon compared to other atoms. When cutting from a silicon carbide ingot to manufacture a silicon carbide wafer, the silicon carbide ingot may be easily cut at an interface between the layer of carbon atoms and the layer of silicon atoms in the silicon carbide ingot or in a direction parallel to the interface, so that the surface where carbon atoms are mainly exposed and the surface where silicon atoms are mainly exposed tend to appear on the cut plane.

The center of the one surface 11 may correspond to the center of a circle or an ellipse when the shape of the silicon carbide wafer 10 is a circle or an ellipse. In addition, a flat zone, a notch, etc. may be formed in a part of the silicon carbide wafer.

The average Rmax roughness of the one surface 11 may be 2.0 nm or less, 1.5 nm or less, or 1.1 nm or less. The average Rmax roughness of the one surface may be 0.1 nm or more. A silicon carbide wafer satisfying this Rmax roughness range has a good height difference between the lowest point and the highest point on the surface, and a high yield during the subsequent epitaxial growth process and a device manufacturing process can be expected.

A difference between the average Rmax roughness of the edge region of the one surface 11 and the average Rmax roughness of the central region of the one surface may be 0.01 nm to 0.5 nm, or 0.1 nm to 0.3 nm. When a range of the Rmax roughness difference between the edge region and the center region is provided in this way, low degree of asymmetry can be exhibited in the main region of the silicon carbide wafer, and the thickness flatness of the epitaxial layer formed in the subsequent process can be increased and a good device manufacturing yield can be obtained.

When measuring the Rmax roughness of the one surface 11, the lowest point (valley) may be −1.0 nm or more, or be −0.8 nm or more, compared to the reference line (center line). When measuring the Rmax roughness of the one surface, the highest point (peak) may be 1 nm or less, or 0.57 nm or less, compared to the reference line. The reference line (center line) may be defined through a roughness measuring device as described in Experimental Examples to be described later.

The average Ra roughness of the one surface 11 may be 0.1 nm or less, 0.08 nm or less, 0.07 nm or less, or 0.05 nm or less. The average Ra roughness of the one surface may be 0.01 nm or more.

The average Ra roughness of the edge region of the one surface 11 may be 0.1 nm or less, 0.08 nm or less, or 0.07 nm or less. The average Ra roughness of the edge region of the one surface may be 0.01 nm or more.

The average Ra roughness of the central region of the one surface 11 may be 1 nm or less or may be 0.07 nm or less.

A silicon carbide wafer satisfying such Ra roughness range may have good quality in a subsequent epitaxial growth process and can provide an improvement in yield in a device manufacturing.

The method described in Experimental Examples to be described later may be applied to the measurement of Ra and Rmax roughness of the silicon carbide wafer 10.

The silicon carbide wafer 10 may have a full width at half maximum (FWHM) of a rocking curve according to high-resolution X-ray diffraction analysis of 0.01° to 0.5°, 0.02° to 0.4°, or 0.1° to 0.4°. A silicon carbide wafer having these characteristics may have excellent crystalline characteristics and may improve the characteristics of a device manufactured through a subsequent process.

The rocking curve is measured by applying a high-resolution X-ray diffraction analysis system (HR-XRD system) to align the [11-20] direction of the silicon carbide wafer to the X-ray path, and setting the X-ray source and X-ray detector at an angle of 2θ (35° to 36°) and then adjusting the omega (ω, or theta θ, X-ray detector) angle according to the off angle of the silicon carbide wafer, and the crystallinity is evaluated through the full width at half maximum value of the rocking curve. Specifically, among silicon carbide wafers to which an off angle selected from the range of 0° to 10° with respect to the (0001) plane of the silicon carbide ingot is applied, when the off angle is 0°, the omega angle is 17.8111°, when the angle is 4°, the omega angle is 13.811°, and when the off angle is 8°, the omega angle is 9.8111°.

The silicon carbide wafer 10 may have a thickness of 150 μm to 900 μm, and the thickness is not limited thereto as long as it is an appropriate thickness applicable to a semiconductor device.

The silicon carbide wafer 10 may include a substantially single-crystal 4H-silicon carbide structure in which polymorphic inclusion is minimized.

The diameter of the silicon carbide wafer 10 may be 4 inches or more, 5 inches or more, or 6 inches or more. The diameter of the wafer may be 12 inches or less, 10 inches or less, or 8 inches or less.

The silicon carbide wafer 10 may be manufactured through a silicon carbide wafer manufacturing method to be described later.

The silicon carbide wafer 10 may be a wafer prior to forming an epitaxial layer on the surface. Exemplarily, the silicon carbide wafer may be cut from the silicon carbide ingot and prior being subjected to planarization and chemical mechanical polishing.

Method of Manufacturing Silicon Carbide Wafer

In order to achieve the above object, the method of manufacturing a silicon carbide wafer according to an embodiment includes: a preparation process of arranging raw material 300 and a silicon carbide seed crystal 110 to be spaced apart from each other in a reactor 200 having an inner space; a growth process of sublimating the raw material by controlling the temperature, the pressure and the atmosphere of the inner space and preparing a silicon carbide ingot 100 grown from the silicon carbide seed crystal; a cooling process of cooling the reactor and recovering the silicon carbide ingot; and a cutting process of cutting the recovered silicon carbide ingot to prepare the silicon carbide wafer, wherein a heat insulating material 400 is disposed to surround an outer surface of the reactor and a heater 600 for controlling the temperature of the inner space is provided, wherein the growth process prepares the silicon carbide ingot by comprising a temperature raising process of raising the temperature of the inner space from room temperature to a first temperature, a first growth process of raising the temperature from the first temperature to a second temperature and a second growth process of maintaining the temperature to the second temperature, wherein the first temperature is a temperature at which a pressure reduction of the inner space starts, wherein the second temperature is a temperature at which the pressure reduction of the inner space is completed and a growth of the silicon carbide ingot is induced under the reduced pressure, wherein a temperature difference is a difference between a temperature of an upper portion of the inner space and a temperature of a lower portion of the inner space, and wherein the temperature at the second temperature is 160° C. to 240° C.

In the preparation process, the raw material 300 and the silicon carbide seed crystal 110 are spaced apart to face each other in the reactor 200 having an inner space.

Figure 2:
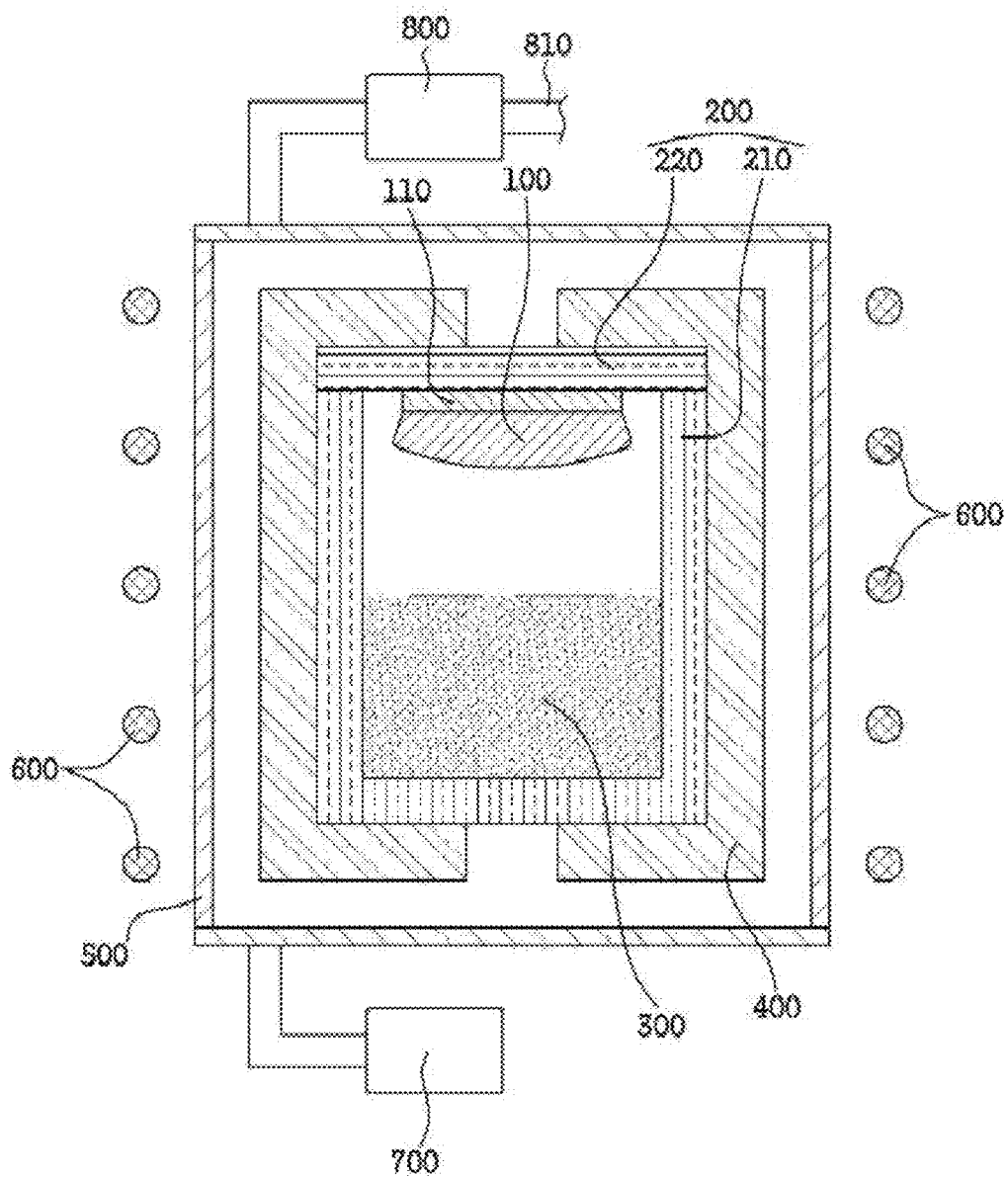
FIG. 2 is a conceptual view showing an example of an apparatus for manufacturing a silicon carbide ingot.

In the method of manufacturing the silicon carbide wafer, the manufacturing of the silicon carbide ingot may be performed through the apparatus shown in FIG. 2.

The silicon carbide seed crystal of the preparation process may be applied with an appropriate size according to the target wafer, and the C surface ((000-1) surface) of the silicon carbide seed crystal may be directed toward the raw material 300.

The silicon carbide seed crystal 110 may include 4H silicon carbide of 4 inches or more, 4H silicon carbide of 6 inches or more, or 4H silicon carbide of 8 inches or more. The silicon carbide seed crystal may be 12 inches or less.

The raw material 300 may be applied in the form of a powder having a carbon source and a silicon source, and a raw material in which the powder is necked to each other or silicon carbide powder in which the surface is carbonized may be applied.

The reactor 200 may be applied as long as it is an appropriate vessel for the silicon carbide ingot growth reaction, and specifically, a graphite crucible may be applied. For example, the reactor may include a body 210 including an inner space and an opening, and a cover 220 corresponding to the opening to form the inner space. The crucible cover may further include a seed crystal holder integrally with or separately from the crucible cover, and the silicon carbide seed crystal may be fixed so that the silicon carbide seed crystal and the raw material face each other through the seed crystal holder.

The reactor 200 may be fixed by being surrounded by the heat insulating material 400, and the heat insulating material surrounding the reactor may be located in the reaction chamber 500 such as a quartz tube. A heater 600 may be provided outside the heat insulating material and the reaction chamber to control the temperature of the inner space of the reactor.

The heat insulating material 400 may have a specific resistance of $8\times10^{-3}$ $\Omega$m or less, $5\times10^{-3}$ $\Omega$m or less, or $3.1\times10^{-3}$ $\Omega$m or less. The heat insulating material may have a specific resistance of $1\times10^{-4}$ $\Omega$m or more, $2.5\times10^{-4}$ $\Omega$m or more, or $1.0\times10^{-4}$ $\Omega$m or more. When a heat insulating material having such a specific resistance is applied, the occurrence of defects in the silicon carbide ingot to be grown can be further reduced.

The heat insulating material 400 may have a porosity of 72% to 95%, 75% to 93%, or 80% to 91%. When the heat insulating material satisfying this porosity is applied, the occurrence of defects in the silicon carbide ingot to be grown can be further reduced.

The heat insulating material 400 may include carbon-based felt, specifically graphite felt, and may include rayon-based graphite felt or pitch-based graphite felt.

The density of the heat insulating material 400 may be 0.14 g/cc to 0.28 g/cc, or 0.15 g/cc to 0.17 g/cc. When a heat insulating material having such a density is applied, a high-quality silicon carbide ingot can be grown.

The reaction chamber 500 may include a vacuum exhauster 700 connected to the inside of the reaction chamber to adjust the degree of vacuum inside the reaction chamber, a plumbing 810 connected to the inside of the reaction chamber to introduce gas into the reaction chamber and a mass flow controller 800 to control the inflow of gas. Through these, it is possible to adjust the flow rate of the inert gas in the subsequent growth process and the cooling process may be controlled.

The growth process may be performed by heating the reactor 200 and the inner space of the reactor by the heater 600, and simultaneously with or separately from the heating, by decreasing the pressure in the inner space to adjust the degree of vacuum, and injecting inert gas, the growth of silicon carbide ingots can be induced.

The heater 600 may be installed to be movable in a vertical direction of the reactor 200, and accordingly, the relative position between the reactor and the heater may be changed, and a temperature difference between the upper portion 230 of the inner space and the lower portion 240 of the inner space can be applied. Specifically, a temperature difference between the silicon carbide seed crystal 110 in the upper portion of the inner space and the raw material 300 in the lower portion thereof can be applied.

The heater 600 may be formed as a spiral coil along the outer peripheral surface of the reactor 200 or the heat insulating material 400 surrounding the reactor.

Figure 4:
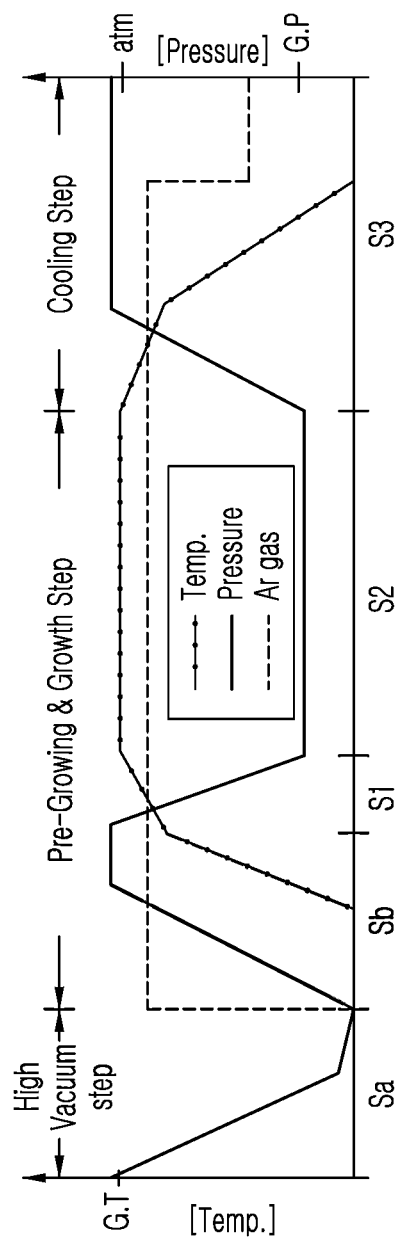
FIG. 4 is a graph showing trends of temperature, pressure and argon gas pressure versus time, in a manufacturing process of a silicon carbide wafer according to an embodiment.

Referring to FIG. 4, the growth process includes: a temperature raising process Sb of raising the temperature of the inner space from room temperature to a first temperature; a first growth process S1 of raising the temperature from the first temperature to the second temperature; and a second growth process S2 of maintaining the temperature at the second temperature, thereby preparing the silicon carbide ingot.

Before the growth process, a pressure decreasing Sa of decreasing the pressure in the inner space in the atmospheric state.

The temperature increase to the first temperature may be performed at a rate of 3° C./min to 13° C./min, or may be performed at a rate of 5° C./min to 11° C./min. The temperature increases to the pre-growth start temperature may be performed at a rate of 7° C./min to 10° C./min.

The pressure decreasing process Sa may be performed so that the pressure of the inner space becomes 10 torr or less, or 5 torr or less.

The temperature raising process Sb may be performed by injecting inert gas such as argon or nitrogen so that the pressure of the inner space becomes 500 torr to 800 torr, and the temperature raising may be performed so that the temperature of the lower portion of the inner space becomes 1500° C. to 1700° C. at a rate of 1° C./min to 10° C./min.

Figure 3:
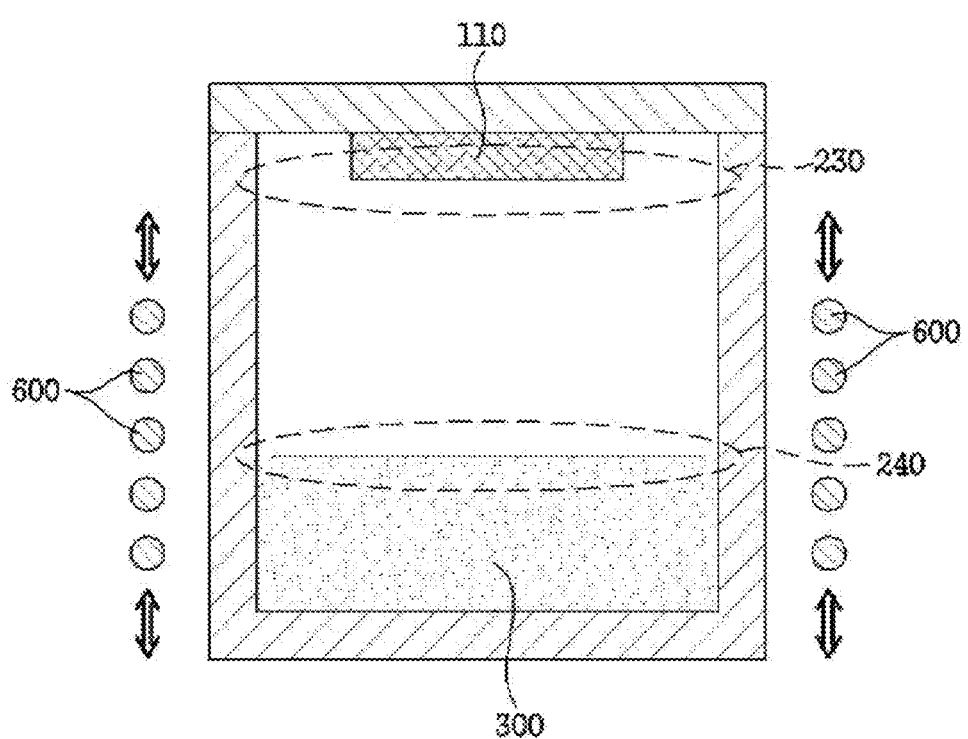
FIG. 3 is a conceptual view showing an example of an inner space of a reaction chamber of apparatus for manufacturing a silicon carbide ingot.

Referring to FIG. 3, in the growth process, the upper portion 230 of the inner space may be a position corresponding to the surface of the silicon carbide seed crystal 110, and the lower portion 240 of the inner space is a position corresponding to the surface of the raw material 300.

The first temperature, which is a temperature at which the sublimation of the raw material 300 starts partially, may be a temperature that has been subjected to the temperature increase process Sb before the growth process as shown in the dotted line region of FIG. 4, and may be a temperature at which a pressure decrease of the inner space starts after the injection of inert gas in the temperature raising process. Specifically, based on the lower portion 240 of the inner space, it may be 1500° C. to 1700° C., 1600° C. to 1640° C.

The first temperature may be 1450° C. to 1650° C., or 1550° C. to 1587° C., based on the upper portion 230 of the inner space.

In the first growth process S1, a temperature difference between the upper portion 230 of the inner space and the lower portion 240 of the inner space at the first temperature may be 40° C. to 60° C., or 50° C. to 55° C.

The second temperature, which is a temperature at which the sublimation of the raw material 300 progresses comprehensively, may be a temperature at which a temperature raise of the first growth process is made as shown in the dotted line area of FIG. 4, and may be a temperature at which the growth of the silicon carbide ingot is induced under the reduced pressure after the completion of the pressure decrease of the inner space. In addition, the growth of carbide ingot can be induced by changing the pressure to ±10% compared to the pressure reduced pressure at the second temperature.

The second temperature may be 2100° C. to 2500° C., based on the lower portion 240 of the inner space, or 2200° C. to 2400° C.

The second temperature may be 1900° C. to 2300° C., based on the upper portion 230 of the inner space, or 2100° C. to 2250° C.

In the first growth process S1, a temperature difference between the upper portion 230 of the inner space and the lower portion 240 of the inner space may be 160° C. to 240° C., or 180° C. to 220° C. The temperature difference may be 196° C. to 207° C. or 202° C. to 207° C.

In the first growth process S1, a temperature difference between the upper portion 230 of the inner space and the lower portion 240 of the inner space may increase together with the temperature increase in the inner space.

The first growth process (S1) has temperatures ranges, temperature difference and temperature change rate of the upper portion 230 of the inner space and the lower portion 240 of the inner space, so an occurrence of the polymorphism other than a desired crystal can be minimized and stable ingot growth can be obtained. If the temperature difference is less than the above-mentioned range at the first temperature and the second temperature of the first growth process, a crystal other than the desired crystal may be mixed, thereby increasing the possibility of forming a polycrystal, and the growth rate may be lowered. On the other hand, if the temperature difference is greater than the above-mentioned range, the quality of the crystal can be deteriorated.

In the first growth process S1, a pressure decrease may be performed together with the temperature increase from the first temperature to the second temperature and may be performed to 1 torr to 50 torr.

The temperature increase rate of the first growth process S1 may be less than the temperature increase rate of the temperature increase process Sb, and may be smaller than the average temperature increase rate of the entire process of the temperature increase process and the first growth process.

The temperature increase rate of the first growth process S1 may be 1° C./min to 5° C./min, or 3° C./min to 5° C./min. Polymorphism other than the desired crystal can be prevented in the above temperature increase rate range and also stable growth can be induced.

The first growth process S1 may proceed to be a maximum heating area of the heater 600 to be the lower portion 240 of the inner space, the surface 240 of the raw material 300, and in case that the heater is a spiral coil, it is possible to apply the target temperature difference between the upper portion 230 of the inner space and the lower portion of the inner space by changing the winding number and thickness, etc.

The second growth process S2 sublimates comprehensively the raw materials 300 to form a carbide ingot by maintaining the second temperature after increasing to the second temperature in the first growth process S1.

The second growth process S2 may proceed for 5 to 180 hours, for 30 hours to 160 hours, or 50 to 150 hours.

The growth process may be carried out by rotating about a vertical axis of the reactor 200 and may maintain the temperature gradient more equally.

The growth process may apply an inert gas of a predetermined flow rate outside the reactor 200. The inert gas may continuously flow into the inner space of the reactor and can flow in a direction from the raw material 300 to the silicon carbide seed crystal 110. Accordingly, a stable temperature gradient of the reactor and the inner space thereof can be formed.

The inert gas of the second growth process S2 may specifically be argon, helium and mixed gas thereof.

After the second growth process S2, the cooling process S3 of cooling the reactor 200 and recovering the silicon carbide ingot may be included.

The cooling process S3 cools the silicon carbide ingot grown through the growth process at a predetermined cooling rate and a predetermined flow rate condition of inert gas.

In the cooling process S3, cooling may be performed at a speed of 1° C./min to 10° C./min or 3° C./min to 9° C./min. The cooling process may be performed at the speed of 5° C./min to 8° C./min.

In the cooling process S3, the pressure control of the inner space of the reactor 200 may be performed simultaneously, and the pressure control may be performed separately from the cooling process. The pressure control may be performed so that the pressure in the inner space is up to 800 torr.

In the cooling process S3, inert gas of a predetermined flow rate may be applied inside the reactor 200, as in the growth process. The inert gas may be an argon and nitrogen for example. The inert gas may continuously flow into the inner space of the reactor and can flow in a direction from the raw material 300 to the silicon carbide seed crystal 110.

The cooling process S3 may include a first cooling process of pressurizing the inner space of the reactor 200 to become atmospheric pressure or more and cooling so that the temperature of the inner space becomes 1500° C. to 1700° C. based on the upper portion 230 thereof; and a second cooling process of cooling the temperature of the inner space at room temperature after the first cooling process.

The recovery of the cooling process S3 may be performed by cutting the rear side of the silicon carbide ingot 100 in contact with the silicon carbide seed crystal 110. The silicon carbide ingot cut in this way minimizes the loss of the rear side in contact with the seed crystal and can have improved crystal quality.

The cutting process is a process of preparing a silicon carbide wafer by cutting the recovered silicon carbide ingot after the cooling process.

In the cutting process, the silicon carbide ingot may be cut to form a predetermined off-angle with the (0001) surface or a surface where growth has started. The off angle of the cutting process may be 0° to 10°.

The cutting process may allow the thickness of the wafer to be 100 μm to 900 μm, but the present disclosure is not limited thereto The processing process for flattening the thickness of the wafer prepared through the cutting process and polishing the surface of the wafer.

The polishing wheel used in the processing process may be a type on the surface of which particles are embedded, and the particles embedded on the surface of the polishing wheel may be a diamond.

The processing process may be performed while the polishing wheel and the wafer rotate in opposite directions.

In the processing process, the diameter of the polishing wheel may be greater than the diameter of the wafer and may be 250 mm or less.

The method may further include wet etching the silicon carbide wafer after the processing process.

The processing process may further include a chemical mechanical polishing process.

The chemical mechanical polishing may be performed by applying an abrasive particle slurry on a rotating plate and contacting a fixed wafer to a rotating polishing head with a predetermined pressure.

In the chemical mechanical polishing, the rotation speed of the plate may be 70 rpm to 180 rpm, 80 rpm to 160 rpm, or 100 rpm to 150 rpm.

In the chemical mechanical polishing, the rotation speed of the polishing head may be 60 rpm to 150 rpm, 70 rpm to 140 rpm, or 90 rpm to 135 rpm.

In the chemical mechanical polishing, the pressure with which the polishing head contacts the wafer on the rotating plate may be 2 psi to 10 psi, 3 psi to 8 psi, or 4 psi to 6 psi.

To satisfy the rotation speed and pressure of the rotating plate and the polishing head, good Rmax roughness and haze characteristics of the silicon carbide wafer are obtained.

After the processing process, a cleaning process through a conventional RCA chemical cleaning solution may be further performed.

The silicon carbide wafer manufactured through the above manufacturing method has advantages of low defect density, small number of impurity particles, good surface roughness characteristics, and good optical characteristics and when this is applied to a device manufacturing, a device having excellent electrical and optical properties can be manufactured.

Method of Manufacturing Epitaxial Wafer

In order to achieve the above object, the method of manufacturing an epitaxial wafer according to an embodiment includes a growth process of injecting a source gas for epitaxial growth into a growth vessel in which the silicon carbide wafer 10 manufactured according to the method is disposed and growing an epitaxial layer on one surface 11 of the wafer according to a chemical vapor deposition method.

The growing process may further include an etching process of gas-etching the surface of the silicon carbide wafer before injecting the source gas. The gas-etching may be performed by maintaining the wafer at a temperature of 1400° C. to 1600° C. and applying hydrogen gas at a predetermined flow rate.

In the growth process, first, a wafer is placed in a growth vessel, the inside of the growth vessel is evacuated to vacuum, and carbon-based gas and silicon-based gas, which are source gases, may be injected. In addition, a doping gas such as nitrogen may be further injected. When the gas is injected, a carbon/silicon atom concentration ratio of the carbon-based gas and the silicon-based gas may be 0.5 to 2.

The carbon-based gas in the growth process may be at least one selected from the group consisting of $CH_4$, $C_2H_4$, $C_2H_6$, $C_3H_6$, $C_3H_8$ and the silicon-based gas may be at least one selected from the group consisting of $SiH_4$, $SiCl_4$, $SiHCl_3$, $SiH_2Cl_2$, $SiH_3Cl$, $Si_2H_6$.

In the growth process, an epitaxial layer may be grown on one surface 11 of the silicon carbide wafer 10 by injecting the gas and maintaining a temperature of 1400° C. to 1700° C.

The thickness of the epitaxial layer of the epitaxial wafer grown through the growth process may be 5 μm to 20 μm.

After the growth process, the source gas injection is stopped, cooling in room temperature is made, the gas is exhausted, the inert gas is pressurized to atmospheric pressure, and then the epitaxial wafer may be recovered.

The growth process may be performed once or twice or more as needed. When the growth process is performed two or more times, a second epitaxial layer (not shown) may be further formed on the epitaxial layer. The growth process repeatedly performed to form the second epitaxial layer may be performed in the same process as applied in the growth process for forming the epitaxial layer, and the temperature, the composition of the source gas, the type of doping gas, etc. may be applied differently from the growth process for forming the epitaxial layer.

Semiconductor Device 1

In order to achieve the above object, the semiconductor device according to an embodiment includes: a silicon carbide wafer 10 according to the above; an epitaxial layer 20 disposed on one surface of the silicon carbide wafer; a barrier region 30 disposed to face the silicon carbide wafer with the epitaxial layer interposed therebetween; a source electrode 41 in contact with the epitaxial layer; a gate electrode 42 disposed on the barrier region; and a drain electrode 43 disposed on the other surface of the silicon carbide wafer.

Figure 7:
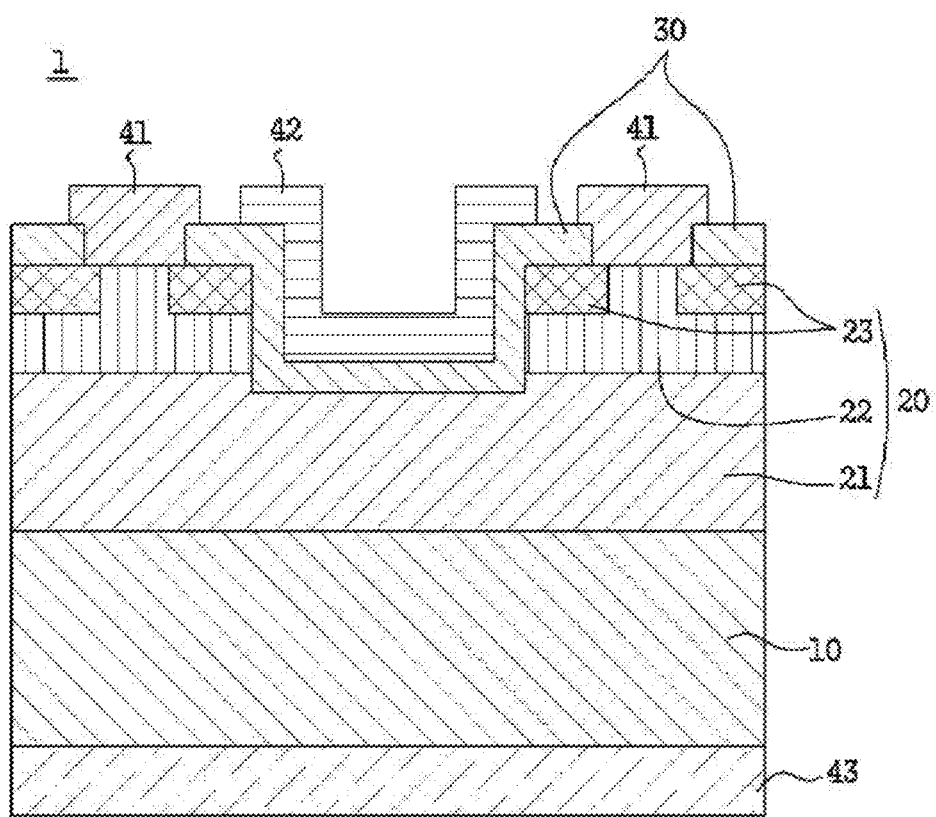
FIG. 7 is a conceptual view of an example of a semiconductor device according to an embodiment.

An example of the semiconductor device 1 is shown in FIG. 7.

The silicon carbide wafer 10 may include n+ type silicon carbide.

Here, the + and − signs of the superscripts indicate relatively carrier concentrations. For example, $n^+$ means an n-type semiconductor that is strongly doped and has a high dopant concentration, and $p^-$ means a p-type semiconductor that is very lightly doped and a relatively low dopant concentration.

The epitaxial layer 20 on the silicon carbide wafer 10 may be formed of a silicon carbide single crystal layer having a small or no lattice constant difference from the silicon carbide wafer.

The epitaxial layer 20 may be formed by a chemical vapor deposition (CVD) process or the like.

The epitaxial layer 20 includes an $n^-$ type epitaxial layer 21 disposed on the n+ type silicon carbide wafer 10; and a $p^+$ type epitaxial layer 22 disposed on the $n^-$ type epitaxial layer.

An n+ type region 23 may be formed by applying selective ion implantation on the $p^+$ type epitaxial layer.

A barrier region having a trench structure dug down to the $n^-$ type epitaxial layer 21 and a gate electrode 42 on the barrier region of the trench structure may be disposed at the center of the semiconductor device 1.

The semiconductor device 1 may reduce the defect rate by applying the silicon carbide wafer 10 manufactured according to the method for manufacturing the silicon carbide ingot and wafer.

Hereinafter, the present invention will be described in more detail through specific examples. The following examples are merely illustrative to help the understanding of the present invention, and the scope of the present invention is not limited thereto.

Example—Manufacturing of Silicon Carbide Wafer

As shown in FIG. 2 as an example of an apparatus for manufacturing a silicon carbide ingot, a silicon carbide powder, which is a raw material 300, is charged in the lower portion of the inner space of the reactor 200, and a silicon carbide seed crystal 110 is disposed on the upper portion. At this time, 6-inch 4H-silicon carbide crystal was applied as the silicon carbide seed crystal, and the silicon carbide seed crystal was fixed in a conventional manner such that the C surface ((000-1) surface) was directed to face the silicon carbide raw material at the bottom of the inner space.

The reactor 200 was sealed, and the outside thereof was surrounded by a heat insulating material 400 having a density shown in Table 1 below, and the reactor was then disposed in a quartz tube 500 provided with a heating coil, which is a heater 600, on the outside thereof. The inner space of the reactor was reduced in pressure to adjust to a vacuum atmosphere, and argon gas was injected so that the inner space reached 760 torr, and then the pressure of the inner space was reduced again. At the same time, the temperature of the inner space was raised to 2300° C. at a temperature increase rate of 5° C./min, and the flow rate of argon gas inside the quartz tube was controlled through the plumbing 810 and the vacuum exhaust device 700 communicating with the quartz tube. A silicon carbide ingot was grown on the front surface of the silicon carbide seed crystal facing the silicon carbide raw material for 100 hours under a temperature of 2300° C. and a pressure of 20 torr.

After growth, the temperature of the inner space was cooled to 25° C. at a rate of 5° C./min to 8° C./min, and at the same time argon or nitrogen gas was injected so that the pressure of the inner space became 760 torr to cool the silicon carbide ingot.

The outer peripheral surface of the cooled silicon carbide ingot was ground and processed into a form having a uniform outer diameter, and the silicon carbide ingot was cut to have an off angle of 4° with the (0001) surface of the silicon carbide ingot, and a silicon carbide wafer having a thickness of 360 μm was prepared. Then, the silicon carbide wafer was ground through a diamond wheel to planarize the thickness, and thereafter, a silica slurry was used for chemical mechanical polishing (CMP) treatment.

It was fixed to the polishing head of the CMP polishing equipment, and one side of the silicon carbide wafer was directed toward the polishing pad on a polishing plate to which a polyurethane-based polishing pad was attached. Then, while injecting the silica slurry, the polishing plate and the polishing head were rotated under the conditions shown in Table 1 below, and one surface of the wafer was polished, and the polished silicon carbide wafer was cleaned and dried.

TABLE 1

|  | Example 1 | Example 2 | Comparative Example 1 | Comparative Example 2 |
|---|---|---|---|---|
| Rotational speed of polishing head [rpm] | 90 | 135 | 180 | 225 |
| Rotational speed of plate [rpm] | 100 | 150 | 200 | 250 |
| Polishing head pressure [psi] | 6 | 4 | 6 | 4 |

Comparative Example—Manufacturing of Silicon Carbide Wafer

In the above example, a silicon carbide wafer was prepared by changing the conditions during the CMP process to Table 1 above.

Figure 5:
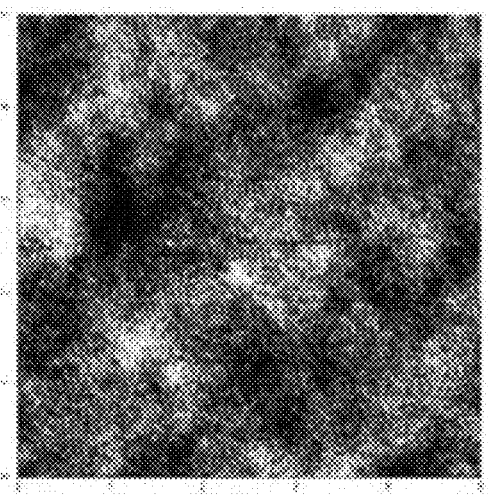
FIG. 5 is a photograph taken through an atomic force microscope when measuring a roughness of Examples 1 and 2 and Comparative Examples 1 and 2 in experimental examples.
Figure 5:
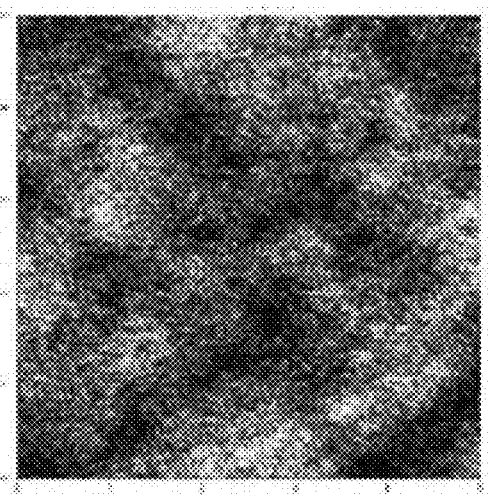
Figure 5:
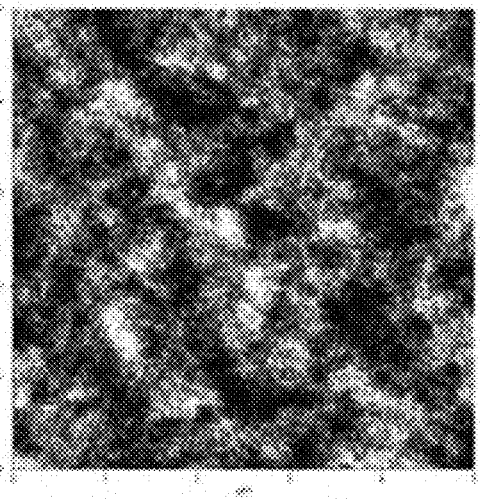
Figure 5:
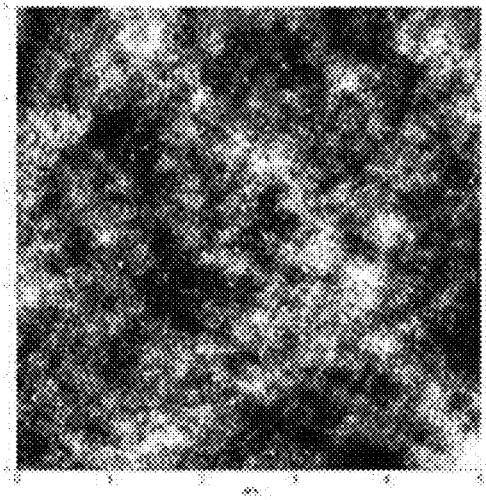

Experimental Example—Measurement of Roughness and Optical Properties of Silicon Carbide Wafer The average Ra roughness and average Rmax roughness characteristics of the silicon carbide wafers prepared in Examples and Comparative Examples were measured through an AFM device (XE-150 manufactured by Park System), and the total light transmittance and the haze were measured through a D65 standard light source of Haze Meter NDH5000W device of NIPPON DENSHOKU. The results are shown in FIG. 5 and Table 2. During measurement, the reference line indicates the center line of the roughness curve of the measurement section. The edge region of one surface of the silicon carbide wafer is an area in which the distance from the edge of the one surface toward the center is 5% to 75% of the radius of the silicon carbide wafer, and the central region of the one surface is an area having a radius of 25% compared to the radius of the silicon carbide wafer from the center of the one surface.

TABLE 2

| Items | Example 1 | Example 2 | Comparative Example 1 | Comparative Example 2 |
|---|---|---|---|---|
| average Ra roughness (central region, edge region) | 0.04 nm | 0.07 nm | central region 0.08 nm, edge region 0.1 nm | central region 0.2 nm, edge region 0.1 nm |
| average Rmax roughness | 1.1 nm | 0.9 nm | 3.5 nm | 4.9 nm |
| Rmax roughness difference between central and edge regions | 0.2 nm or less | 0.3 nm or less | More than 1.1 nm | More than 1.5 nm |
| Depth of lowest point compared to reference line | −0.803 nm | −0.367 nm | −1.965 nm | −2.782 nm |
| Depth of highest point compared to reference line | 0.247 nm | 0.567 nm | 1.512 nm | 2.124 nm |
| Total light transmittance | 29.5% | 20.8% | 25.4% | 36.9% |
| haze | 0.37% | 0.34% | 0.52% | 0.71% |

Referring to Table 2, in the case of Examples, the average Ra roughness is 0.1 nm or less, the average Rmax roughness is 2.0 nm or less, the Rmax roughness difference between the central region and the edge region is 0.5 nm or less, and the haze is in the range of 0.3% to 0.5%. In Comparative Example, the average Rmax roughness is 3.5 nm or more, the roughness difference between the central region and the edge region is more than 0.5 nm, and the haze value was also more than 0.52%, indicating poor roughness and optical properties.

Experimental Example—Measurement of Yield in Epitaxial Wafer Manufacturing

An epitaxial layer was formed on the silicon carbide wafer prepared in Examples and Comparative Examples in a conventional manner as follows.

A silicon carbide wafer was placed in a chamber, carbon-based and silicon-based gases for epitaxial growth were injected, and a silicon carbide epitaxial layer was grown on one surface of the silicon carbide wafer by chemical vapor deposition.

Figure 6:
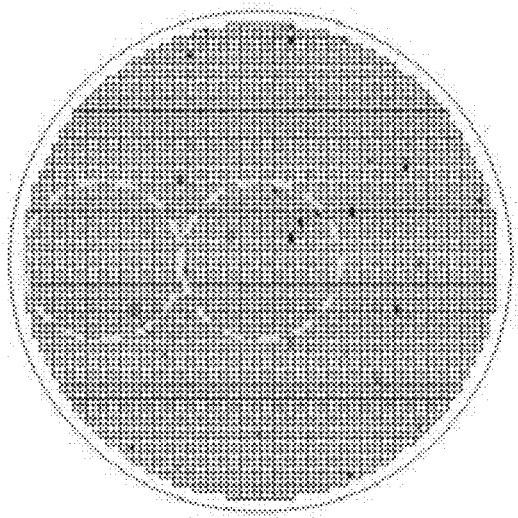
FIG. 6 is a conceptual view showing the yield when forming an epitaxial layer of Examples 1 and 2 and Comparative Examples 1 and 2 in experimental examples.
Figure 6:
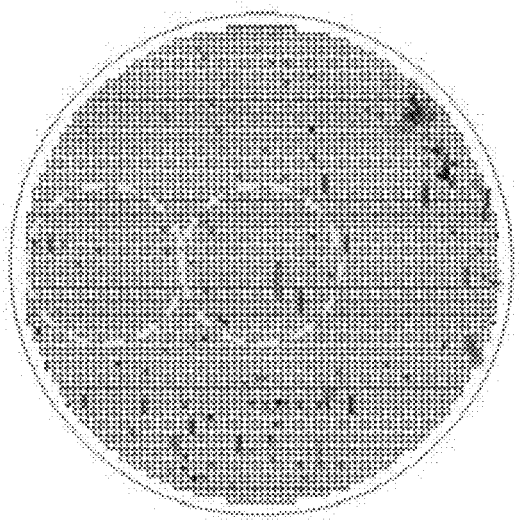
Figure 6:
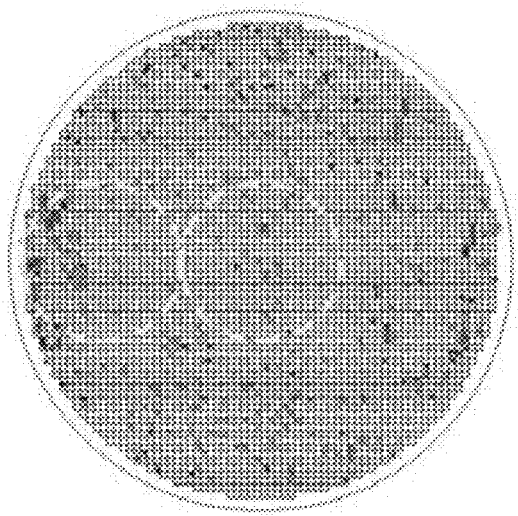
Figure 6:
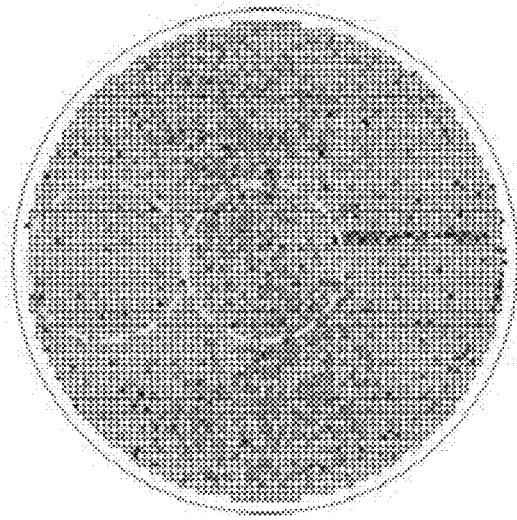

When the epitaxial layer of the silicon carbide wafer was evaluated with KLA Tencor's Candela 8520 equipment, the areas with the stacking fault, triangle and carat defects, which are major defects in the epitaxial layer, were judged as defective and the manufacturing yield was visualized in FIG. 6. In the case of Examples 1 and 2, yields were 98.9% and 94.7%, respectively, and in Comparative Examples 1 and 2, yields were 88.9% and 75.8%, respectively, so that it was confirmed that a high manufacturing yield of 90% or more can be realized when the epitaxial layer was prepared based on a silicon carbide wafer having excellent Rmax roughness and haze characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A silicon carbide wafer comprising one surface and the other surface opposite to the one surface,
    wherein an average Rmax roughness of the one surface is 2.0 nm or less,
    wherein an average Ra roughness of the one surface is 0.1 nm or less,
    wherein an edge region is a region in which a distance from an edge of the silicon carbide wafer toward a center is 5% to 75% of a radius of the silicon carbide wafer,
    wherein a central region is a region having a radius of 25% of the radius of the silicon carbide wafer at the center of the silicon carbide wafer, and
    wherein a difference between an average Rmax roughness of the edge region of the one surface and an average Rmax roughness of the central region of the one surface is 0.01 nm to 0.5 nm.

2. The silicon carbide wafer of claim 1, wherein a total light transmittance for a D65 standard light source is 10% to 40%.

3. The silicon carbide wafer of claim 1, wherein the average Rmax roughness of the one surface is 1.5 nm or less.

4. The silicon carbide wafer of claim 1, wherein the difference between the average Ra roughness of the edge region of the one surface and the average Ra roughness of the central region of the one surface is 0.08 nm or less.

5. The silicon carbide wafer of claim 1, wherein a haze for a D65 standard light source is 0.3% to 0.5%.

6. The silicon carbide wafer of claim 1, wherein the average Ra roughness of the silicon carbide wafer is 0.07 nm or less.

7. The silicon carbide wafer of claim 1, wherein the one surface is a Si surface where silicon atoms appear more mainly than carbon atoms.

8. The silicon carbide wafer of claim 1, wherein a diameter of the silicon carbide wafer is 4 inches or more and comprises 4H-silicon carbide.

9. An epitaxial wafer comprising:
    a silicon carbide wafer of claim 1; and
    an epitaxial layer that is formed on the one surface of the silicon carbide wafer.

10. A semiconductor device comprising:
    a silicon carbide wafer of claim 1;
    an epitaxial layer that is formed on the one surface of the silicon carbide wafer;
    a barrier region disposed opposite to the silicon carbide wafer with the epitaxial layer interposed therebetween;
    a source electrode in contact with the epitaxial layer;
    a gate electrode disposed on the barrier region; and
    a drain electrode disposed on the other surface of the silicon carbide wafer.

* * * * *